United States Patent
Geiger et al.

(10) Patent No.: US 12,396,232 B2
(45) Date of Patent: Aug. 19, 2025

(54) III-N DIODES WITH N-DOPED WELLS AND CAPPING LAYERS

(71) Applicant: Intel Corporation, Santa Clara, CA (US)

(72) Inventors: Richard Geiger, Munich (DE); Georgios Panagopoulos, Munich (DE); Luis Felipe Giles, Neubiberg (DE); Peter Baumgartner, Munich (DE); Harald Gossner, Riemerling (DE); Sansaptak Dasgupta, Hillsboro, OR (US); Marko Radosavljevic, Portland, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 846 days.

(21) Appl. No.: 17/459,986

(22) Filed: Aug. 27, 2021

(65) Prior Publication Data

US 2023/0068318 A1 Mar. 2, 2023

(51) Int. Cl.
*H10D 62/854* (2025.01)
*H10D 8/01* (2025.01)
(Continued)

(52) U.S. Cl.
CPC ............ *H10D 62/854* (2025.01); *H10D 8/01* (2025.01); *H10D 62/8503* (2025.01); *H10D 84/811* (2025.01)

(58) Field of Classification Search
CPC .......... H01L 29/66257; H01L 29/7308; H01L 29/872; H01L 29/66212; H01L 29/66143;
(Continued)

(56) References Cited

U.S. PATENT DOCUMENTS

| 6,949,774 B2 * | 9/2005 | Parikh | H10D 64/64 257/104 |
| 2006/0081897 A1 * | 4/2006 | Yoshida | H10D 64/64 257/E29.198 |
| 2012/0146093 A1 * | 6/2012 | Shibata | H10D 64/256 257/192 |

(Continued)

OTHER PUBLICATIONS

Dadgar, A. (2015), Sixteen years GaN on Si. Phys. Status Solidi B, 252: 1063-1068. https://doi.org/10.1002/pssb.201451656 (Year: 2015).*

(Continued)

*Primary Examiner* — Matthew C Landau
*Assistant Examiner* — Nora T. Nix
(74) *Attorney, Agent, or Firm* — Akona IP PC

(57) ABSTRACT

Disclosed herein are IC devices, packages, and device assemblies that include III-N diodes with n-doped wells and capping layers. An example IC device includes a support structure and a III-N layer, provided over a portion of the support structure, the III-N layer including an n-doped well of a III-N semiconductor material having n-type dopants with a dopant concentration of at least $5 \times 10^{17}$ dopants per cubic centimeter. The IC device further includes a first and a second electrodes and at least one capping layer. The first electrode interfaces a first portion of the n-doped well. The capping layer interfaces a second portion of the n-doped well and includes a semiconductor material with a dopant concentration below $10^{17}$ dopants per cubic centimeter. The second electrode is provided so that the capping layer is between the second portion of the n-doped well and the second electrode.

23 Claims, 10 Drawing Sheets

(51) Int. Cl.
*H10D 62/85* (2025.01)
*H10D 84/80* (2025.01)

(58) Field of Classification Search
CPC ............. H01L 27/0629; H01L 27/0635; H01L 21/0495; H10D 64/649; H10D 8/60–605; H10D 8/051; H10D 62/85–854; H10D 84/05
See application file for complete search history.

(56) References Cited

U.S. PATENT DOCUMENTS

2014/0306235 A1* 10/2014 Decoutere .............. H10D 84/01 438/172
2019/0148563 A1* 5/2019 Sasaki ................... H01L 29/47 257/43
2020/0105744 A1* 4/2020 Dasgupta ............. H10D 89/611
2020/0411699 A1 12/2020 Gossner et al.

OTHER PUBLICATIONS

Dadgar, A. (2015), Sixteen years GaN on Si. Phys. Status Solidi B, 252: 1063-1068. https://doi.org/10.1002/pssb.201451656;hereinafter Dadgar. (Year: 2015).*

Then, H.W., et al. "High-Performance Low-Leakage Enhancement-Mode High-K Dielectric GaN MOS-HEMTs for Energy-Efficient, Compact Voltage Regulators and RF Power Amplifiers for Low-Power-Mobile SoCs," 2015 Symposium on VLSI Technology, Jun. 15-18, 2015; 2015 Symposium on VLSI Technology Digest of Technical Papers, pp. T202-T203.

Yao, Yao, et al., "Current transport mechanism of AlGaN/GaN Schottky barrier diode with fully recessed Schottky anode," Published Dec. 4, 2014, Japanese Journal of Applied Physics, vol. 54, No. 1; 7 pages.

* cited by examiner

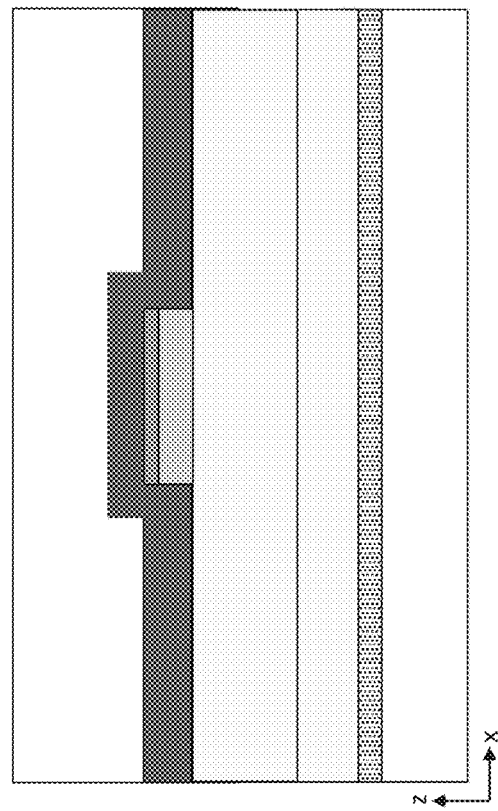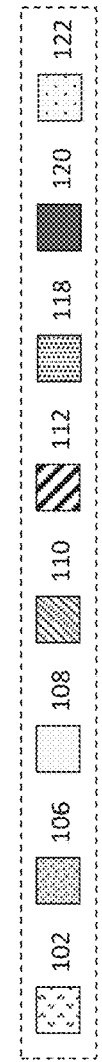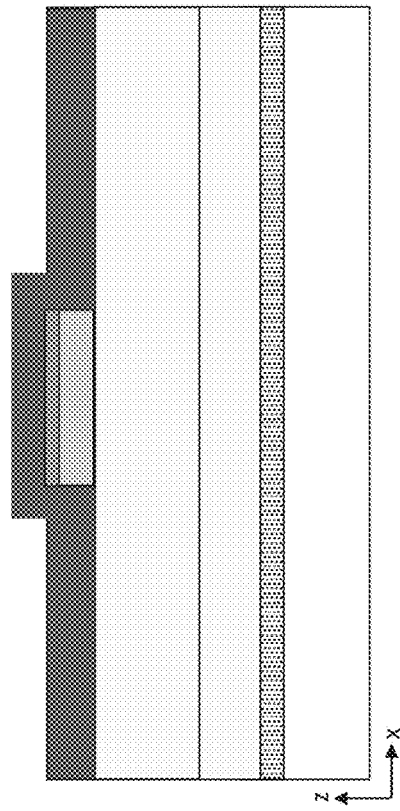
FIG. 3D
FIG. 3C

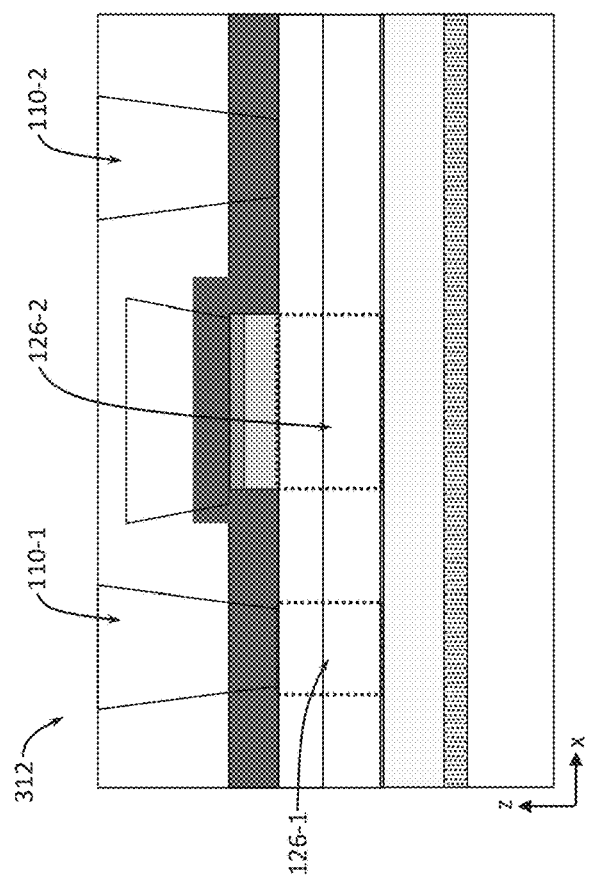
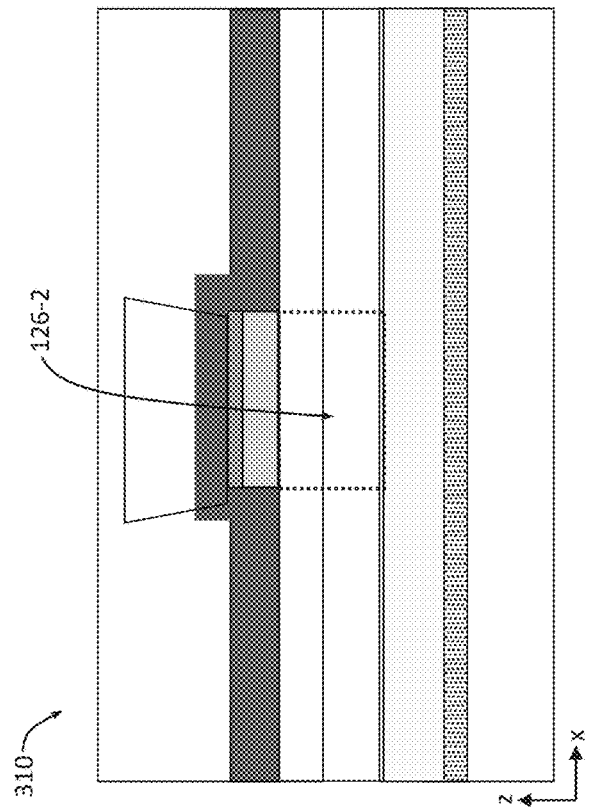
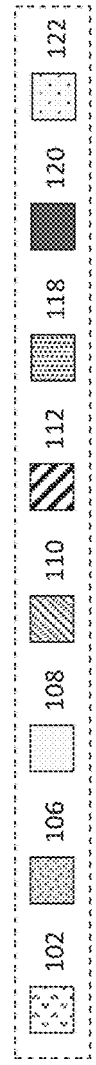
FIG. 3E
FIG. 3F

III-N DIODES WITH N-DOPED WELLS AND CAPPING LAYERS

BACKGROUND

Solid-state devices that can be used in high voltage and/or high frequency applications are of great importance in modern semiconductor technologies. For example, radio frequency (RF) integrated circuits (RFIC) and power management integrated circuits (PMIC) may be critical functional blocks in system on a chip (SoC) implementations. Such SoC implementations may be found in mobile computing platforms such as smartphones, tablets, laptops, netbooks, and the like. In such implementations, the RFIC and PMIC are important factors for power efficiency and form factor and can be equally or even more important than logic and memory circuits.

Due, in part, to their large band gap and high mobility, III-N material based devices, such as gallium nitride (GaN) based diodes and transistors, may be particularly advantageous for high voltage and/or high frequency applications.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 3A-3F are various views illustrating different example stages in the manufacture of an IC device that includes a III-N diode with an n-doped well and one or more capping layers using the method of FIG. 2, according to some embodiments of the present disclosure.

DETAILED DESCRIPTION

Overview

Figure 1:
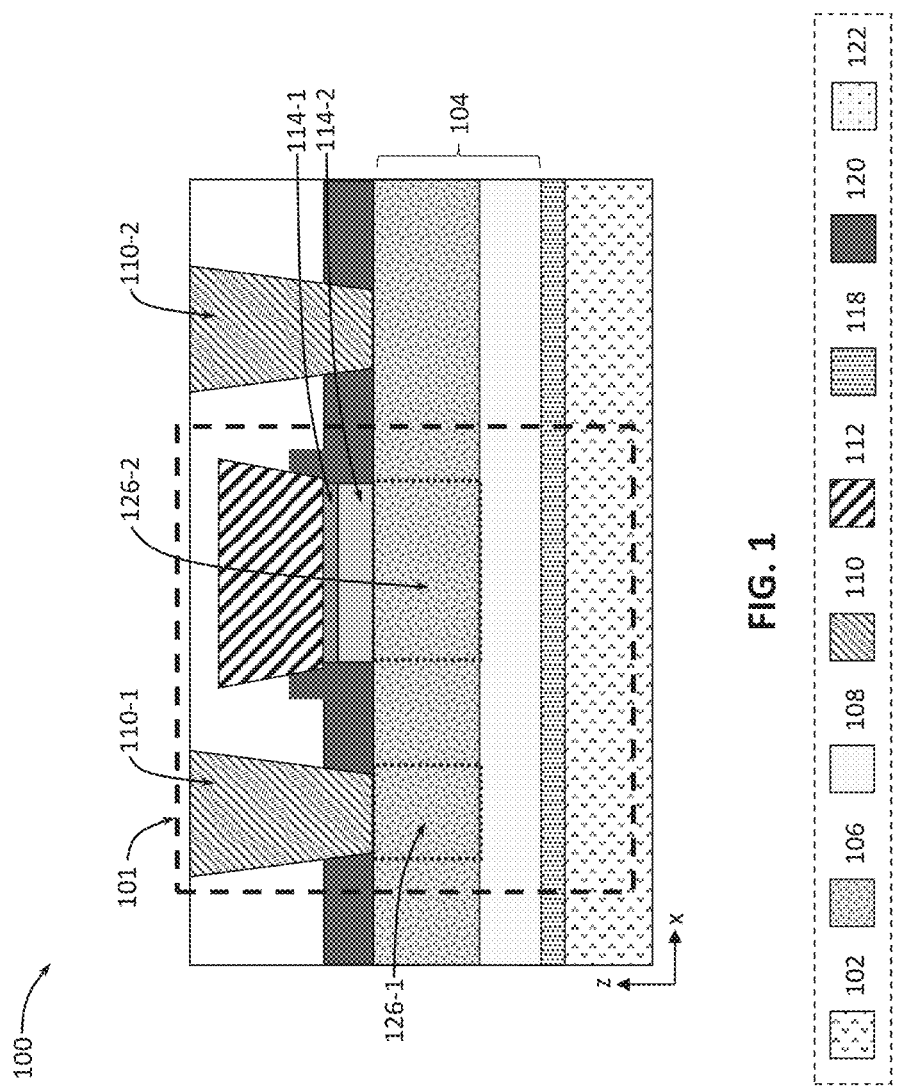
FIG. 1 provides a cross-sectional side view illustrating an integrated circuit (IC) device that includes a III-N diode with an n-doped well and one or more capping layers, according to some embodiments of the present disclosure.

The systems, methods and devices of this disclosure each have several innovative aspects, no single one of which is solely responsible for all desirable attributes disclosed herein. Details of one or more implementations of the subject matter described in this specification are set forth in the description below and the accompanying drawings.

For purposes of illustrating III-N diodes with n-doped wells and capping layers as described herein it might be useful to first understand phenomena that may come into play in III-N technology. The following foundational information may be viewed as a basis from which the present disclosure may be properly explained. Such information is offered for purposes of explanation only and, accordingly, should not be construed in any way to limit the broad scope of the present disclosure and its potential applications.

As mentioned above, III-N material based devices have properties that make them particularly advantageous for certain applications. For example, because GaN has a larger band gap (about 3.4 electron-volts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, GaN devices may advantageously employ a 2D electron gas (2 DEG) (i.e., a group of electrons, an electron gas, free to move in two dimensions but tightly confined in the third dimension, e.g., a 2D sheet charge) as their transport channels, enabling high mobilities without using impurity dopants. For example, the 2D sheet charge may be formed at an abrupt heterojunction interface formed by deposition (e.g., epitaxial deposition), on GaN, of a charge-inducing film of a material having larger spontaneous and piezoelectric polarization, compared to GaN (such a film is generally referred to as a "polarization layer"). Providing a polarization layer on a III-N material such as GaN, thus forming a heterostructure layer stack, allows forming very high charge densities without intentionally added impurity dopants, which, in turn, enables high mobilities.

Despite the advantages, there are some challenges associated with III-N devices which hinder their large-scale implementation. One such challenge resides in the absence of viable p-type doping available due to the complexity of activating p-type dopants in GaN and other III-N semiconductors. This leads to the lack of p-n junction diodes in III-N technology. However, p-n junctions are essential building blocks widely used for rectification (e.g., in diodes), variable capacitances (e.g., in varactors), or voltage reference circuits (e.g., in bipolar transistors), to name a few. One prominent example illustrating the necessity of p-n junction diodes is electrostatic discharge (ESD) protection circuitry, which is indispensable for any technology. Therefore, there is the strong need to enable rectifying devices in III-N technology which could fulfil the requirements of ESD protective diodes, particularly the ability to handle large currents under forward bias.

In state-of-the-art solutions for GaN transistor technologies, a diode is formed by establishing an ohmic contact for the cathode and, for the anode, a Schottky contact to the 2 DEG of a heterostructure layer stack, where the anode is fully recessed so that the anode material contacts the edge (including the sidewall) of the III-N material stack, e.g., as described in "Current transport mechanism of AlGaN/GaN Schottky barrier diode with fully recessed Schottky anode" by Yao Yao et. al., published in Japanese Journal of Applied Physics 54, 011001, in 2015). Inventors of the present disclosure realized that such a design is limited in its current carrying capabilities due to the low injection efficiency of electrons into the 2 DEG channel. This injection occurs at the anode either by tunneling through the thick, large-band gap polarization layer, or by tunneling through the recessed GaN edge. Owing to the thinner electronic barrier at the anode/GaN edge, the injection of electrons from the recessed edge is dominant. However, this perimeter-type injection cannot be scaled with anode area and, thus, high currents as required for ESD protection cannot be achieved.

Disclosed herein are IC devices, packages, and device assemblies that include III-N diodes with n-doped wells and capping layers. An example IC device may include a support structure and a III-N layer, provided over a portion of the support structure, the III-N layer including a III-N semiconductor material (in the following, also referred to simply as an "III-N material") having n-type dopants with a dopant concentration of at least $5 \times 10^{17}$ dopants per cubic centimeter. The III-N material with such n-type dopants may be referred to as an "n-doped well." The example IC device may further include a first and a second electrodes and at least one capping layer. The first electrode (e.g., a cathode) may interface (e.g., be in contact with) a first portion of the n-doped well. The capping layer may interface (e.g., be in contact with) a second portion of the n-doped well and may include a semiconductor material with a dopant concentration below $10^{17}$ dopants per cubic centimeter (e.g., the capping layer may include an intrinsic or a low-doped semiconductor material). The second electrode (e.g., an anode) may be provided so that the capping layer is between the second portion of the n-doped well and the second electrode. Embodiments of the present disclosure are based on recognition that forming a Schottky diode based on an n-doped well of a M-N material may be used to address the problem of limited injection into the 2 DEG, present in state-of-the-art designs as described above. One or more additional capping layers provided on top of the n-doped well may be used to achieve a sufficiently large Schottky barrier below the anode. No capping layers need to be provided between the n-doped well and the cathode. In diode structures with n-doped wells and capping layers as described herein, the current path is not limited to the narrow 2 DEG channel. Instead, the current will flow towards the cathode through the entire depth/volume of the n-doped well. Therefore, the resistivity may be significantly reduced, and much larger currents can be achieved despite a reduction in carrier mobility due to ionized impurity scattering caused by the presence of the n-type dopants in the n-doped well of the III-N material. Consequently, the maximum reachable currents can be easily improved by scaling the geometrical parameters of the n-doped well.

In the present descriptions, various aspects of the illustrative implementations are described using terms commonly employed by those skilled in the art to convey the substance of their work to others skilled in the art. For example, the term "III-N material" refers to a compound semiconductor material with a first sub-lattice of at least one element from group III of the periodic table (e.g., Al, Ga, In) and a second sub-lattice of nitrogen (N), while the term "III-N device" (e.g., a III-N diode or a III-N transistor) refers to a device that includes a III-N material (which may include one or more different III-N materials, e.g., a plurality of different III-N materials stacked over one another) as an active material. In another example, the terms "oxide," "carbide," "nitride," etc. refer to compounds containing, respectively, oxygen, carbon, nitrogen. Similarly, the terms naming various compounds refer to materials having any combination of the individual elements within a compound (e.g., the terms "gallium nitride" or "GaN" refer to a material that includes gallium and nitrogen, the terms "aluminum indium gallium nitride" or "AlInGaN" refer to a material that includes aluminum, indium, gallium and nitrogen, and so on). In yet another example, the term "high-k dielectric" refers to a material having a higher dielectric constant than silicon oxide, while the term "low-k dielectric" refers to a material having a lower dielectric constant than silicon oxide. The terms "substantially," "close," "approximately," "near," and "about," generally refer to being within +/−10% of a target value, e.g., within +/−5% of a target value, based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

IC devices as described herein, in particular IC devices that include III-N diodes with n-doped wells and capping layers, may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. In some embodiments, IC devices as described herein may be included in an radio frequency IC (RFIC), which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, IC devices as described herein may be included in ESD protection devices or circuits. In some embodiments, the IC devices as described herein may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

Further, references are made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 3A-3F, such a collection may be referred to herein without the letters, e.g., as "FIG. 3."

In the drawings, some schematic illustrations of example structures of various devices and assemblies described herein may be shown with precise right angles and straight lines, this is simply for ease of illustration, and embodiments of these assemblies may be curved, rounded, or otherwise irregularly shaped as dictated by, and sometimes inevitable due to, the manufacturing processes used to fabricate semiconductor device assemblies. Therefore, it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of presence of one or more III-N diodes with n-doped wells and capping layers as described herein.

Various operations may be described as multiple discrete actions or operations in turn, in a manner that is most helpful in understanding the claimed subject matter. However, the order of description should not be construed as to imply that these operations are necessarily order dependent. These operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges.

The description uses the phrases "in an embodiment" or "in embodiments," which may each refer to one or more of the same or different embodiments. The terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

Example III-N Diode with an n-Doped Well and One or More Capping Layers

FIG. 1 provides a cross-sectional side view illustrating an IC device 100 that includes a III-N diode 101 (an approximate boundary of which is illustrated in FIG. 1 with a dashed contour) with an n-doped well and one or more capping layers, according to some embodiments of the present disclosure. A legend provided within a dashed box at the bottom of FIG. 1 illustrates colors/patterns used to indicate some of the elements of the IC device 100 so that FIG. 1 is not cluttered by too many reference numerals. For example, FIG. 1 uses different colors/patterns to identify a support structure 102, an n-doped well 106, a buffer layer 118, etc.

As shown in FIG. 1, the IC device 100 may include a support structure 102, and a III-N layer 104, provided over the support structure 102, the III-N layer 104 including an n-doped well 106. Optionally, the III-N layer 104 may also include a further III-N material 108, e.g., as shown in FIG. 1, where the further III-N material 108 may be a low-doped or undoped III-N material, while dopant concentration of the n-doped well 106 may be higher than that of the further III-N material 108. The IC device 100 may further include one or more first electrodes 110 and one or more second electrodes 112 over various portions of the n-doped well 106 (e.g., the IC device 100 may include two first electrodes 110, one on either side of the second electrode 112, as shown in FIG. 1), as well as one or more capping layers 114 between the second electrodes 112 and the n-doped well 106 of the III-N layer 104. In some embodiments, the IC device 100 may further include a buffer layer 118, a passivation layer 120, and an insulator 122.

The support structure 102 may be any suitable support structure, e.g., a substrate, a die, a wafer, or a chip, on which III-N diodes as described herein may be implemented. In some embodiments, the support structure 102 may include a semiconductor, such as silicon. In other implementations, the support structure 102 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials. In some embodiments, the support structure 102 may include a ceramic material, or any other non-semiconductor material. For example, in some embodiments, the support structure 102 may include glass, a combination of organic and inorganic materials, embedded portions having different materials, etc. Although a few examples of materials from which the support structure 102 may be formed are described here, any material that may serve as a foundation upon which at least one III-N diode with an n-doped well and one or more capping layers as described herein may be built falls within the spirit and scope of the present disclosure.

Although not specifically shown in FIG. 1, in some embodiments, the support structure 102 of the IC device 100 may include an insulating layer, such as an oxide isolation layer, provided thereon. For example, in some embodiments, a layer of an insulator 122 may be provided over the support structure 102 (not shown in FIG. 1). The insulator 122 may include any suitable insulating material, e.g., any suitable interlayer dielectric (ILD), to electrically isolate the semiconductor material of the support structure 102 from other regions of or surrounding the III-N diode 101. Providing such an insulating layer over the support structure 102 may help mitigate the likelihood that conductive pathways will form through the support structure 102. Examples of the insulator 122 may include, in some embodiments, silicon oxide, silicon nitride, aluminum oxide, and/or silicon oxynitride. In general, the insulator 122 may be provided in various portions of the IC device 100. In some embodiments, the insulator 122 may include a continuous insulator material encompassing at least portions of the III-N diode 101, e.g., as shown in FIG. 1. In various embodiments, the insulator 122 may include different insulating materials in different portions of the IC device 100.

The III-N layer 104 may be formed of a III-N semiconductor material, i.e., of a compound semiconductor with a first sub-lattice of at least one element from group III of the periodic table (e.g., Al, Ga, In), and a second sub-lattice of nitrogen (N). In some embodiments, the III-N material of the III-N layer 104 may be a binary, ternary, or quaternary III-N compound semiconductor that is an alloy of two, three, or even four elements from group III of the periodic table (e.g., boron, aluminum, indium, gallium) and nitrogen. For example, the III-N material of the III-N layer 104 may include nitrogen and gallium, and optionally, one or more of indium or aluminum (e.g., GaN, InGaN, or AlGaN). In some embodiments, the III-N material of the III-N layer 104 may advantageously be a M-N material having a high electron mobility, such a, but not limited to GaN, InGaAs, InP, InSb, and InAs. For some $In_xGa_{1-x}As$ embodiments, In content (x) may be between 0.6 and 0.9, and advantageously is at least 0.7 (e.g., $In_{0.7}Ga_{0.3}As$). For some such embodiments, the III-N material may be a ternary III-N alloy, such as InGaN, or a quaternary III-N alloy, such as AlInGaN. In some embodiments, the III-N material of the III-N layer 104 may be a semiconductor material having a band gap greater than a band gap of silicon (i.e., greater than about 1.1 eV), preferably greater than 1.5 eV, or greater than 2 eV. In some embodiments, the III-N material of the III-N layer 104 may be formed of a highly crystalline semiconductor, e.g., of substantially a monocrystalline semiconductor (possibly with some limited amount of defects, e.g., dislocations).

In some embodiments, the III-N material of the n-doped well 106 may be substantially the same as the III-material of the further III-N material 108 (i.e., these materials may have substantially the same material compositions), except for the differences in the doping levels of the III-material of the n-doped well 106 and the further III-N material 108. For example, in some embodiments, the n-doped well 106 may be formed by doping the upper layer of the III-N material of the III-N layer 104 with n-type dopants so that the upper layer forms the n-doped well 106 and the remaining portion of the III-N layer 104 is not substantially doped, thus forming the further III-N material 108. However, in other embodiments, the III-N material of the n-doped well 106 and the further III-N material 108 may include different III-N materials. Regardless of the exact material compositions, the n-doped well 106 may include n-type dopants in dopant concentrations noticeably higher than those of the further III-N material 108 or other remaining portions of the III-N layer 104. In particular, the n-doped well 106 may include the n-type dopants (e.g., silicon, germanium, selenium, oxygen, telluride, zinc, nitrogen, and so on) at a dopant concentration of at least about $5 \times 10^{17}$ dopants per cubic centimeter, e.g., at least $1 \times 10^{18}$ dopants per cubic centimeter. In contrast, the remaining portions of the III-N layer 104 (i.e., outside of the n-doped well 106, e.g., the further III-N material 108) may include low-doped or substantially intrinsic III-N material with dopant concentrations of n-type dopants being below $10^{17}$ dopants per cubic centimeter, e.g., below $10^{16}$ dopants per cubic centimeter. In some embodiments, the further III-N material 108 may be an intrinsic III-N semiconductor material or alloy, not intentionally doped with any electrically active impurities. In alternate embodiments, one or more a nominal impurity dopant level may be present within the III-N material of the III-N layer 104 outside of the n-doped well 106 (e.g., within the further III-N material 108), for example to set a threshold voltage of a III-N transistor that may be provided in the IC device 100 along with the III-N diode 101 (such a III-N transistor not shown in FIG. 1 but shown, e.g., in FIG. 4), or to provide halo pocket implants, etc. In such impurity-doped embodiments however, impurity dopant level within the III-N material of the III-N layer 104 outside of the n-doped well 106 may be relatively low, e.g., below $10^{15}$ dopants per cubic centimeter, or below $10^{13}$ dopants per cubic centimeter.

FIG. 1 illustrates that, in some embodiments, the n-doped well 106 may be provided as an upper layer of at least a portion of the III-N layer 104, i.e., at least a portion of the further III-N material 108 may be provided between the n-doped well 106 and the support structure 102. However, in other embodiments, all of the thickness of at least a portion of the III-N layer 104 may be doped with n-type dopants of sufficient dopant concentration so that all of the thickness of that portion of the III-N layer 104 is the n-doped well 106. In various embodiments, a thickness of the n-doped well 106 may be between about 50 and 5000 nanometers, e.g., between about 50 and 2000 nanometers, or between about 100 and 1000 nanometers. In the embodiments where low-doped or intrinsic further III-N material 108 remains between the n-doped well 106 and the support structure 102, a thickness of such a material may be between about 50 and 5000 nanometers, e.g., between about 50 and 2000 nanometers, or between about 100 and 1000 nanometers. Unless specified otherwise, all thicknesses described herein refer to a dimension measured in a direction perpendicular to the support structure 102.

In some embodiments, the IC device 100 may, optionally, include a buffer material 118 between the III-N material of the III-N layer 104 and the support structure 102. In some embodiments, the buffer material 118 may be a layer of a semiconductor material that has a band gap larger than that of the III-N material of the III-N layer 104, so that the buffer material 118 can serve to prevent current leakage from various III-N devices built based on the III-N layer 104 to the support structure 102. A properly selected semiconductor for the buffer material 118 may also enable better epitaxy of the III-N material of the III-N layer 104 thereon, e.g., it may improve epitaxial growth of the III-N material of the III-N layer 104, for instance in terms of a bridge lattice constant or amount of defects. For example, a semiconductor that includes aluminum, gallium, and nitrogen (e.g., AlGaN) or a semiconductor that includes aluminum (Al) and nitrogen (N), e.g., AlN, may be used as the buffer material 118 when the III-N material of the III-N layer 104 is a semiconductor that includes gallium and nitrogen (e.g., GaN). Other examples of materials for the buffer material 118 may include materials typically used as ILD, described above, such as oxide isolation layers, e.g., silicon oxide, silicon nitride, aluminum oxide, and/or silicon oxynitride. When implemented in the IC device 100, the buffer material 118 may have a thickness between about 100 and 5000 nm, including all values and ranges therein, e.g., between about 200 and 1000 nanometers, or between about 250 and 500 nanometers.

FIG. 1 further illustrates a first portion 126-1 of the n-doped well 106 and a second portion 126-2 of the n-doped well 106 (an approximate boundary of each shown in FIG. 1 with a respective dotted contour). As shown in FIG. 1, an electrode 110-1 (e.g., a cathode) may interface (e.g., be in contact with) the first portion 126-1, while an electrode 112 (e.g., an anode) may be provided over the second portion 126-2 but not be in contact with the second portion 126-2. Instead, at least one capping layer 114 may be provided between the electrode 112 and the second portion 126-2. FIG. 1 illustrates an embodiment of the IC device 100 where a first capping layer 114-1 and a second capping layer 114-2 are provided, but, in other embodiments of the IC device 100, the second capping layer 114-2 may be absent, or additional capping layers may be present besides the capping layers 114-1 and 114-2. Each of the electrodes 110 and 112 may include any suitable electrically conductive material, alloy, or a stack of multiple electrically conductive materials. In some embodiments, the electrically conductive materials of any of the electrodes 110 and 112 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the electrically conductive materials of the electrodes 110 and 112 may include one or more electrically conductive alloys, oxides, or carbides of one or more metals.

Sufficiently high dopant concentration of the n-type dopants in the n-doped well 106 ensures a good ohmic contact (i.e., a contact with sufficiently low resistance) between the first portion 126-1 and the electrode 110-1. Because the rectification of the metal-semiconductor junction degrades with increasing n-doping density, one or more capping layers 114 are introduced between the electrode 112 and the second portion 126-2 to form a Schottky contact of a sufficient barrier height. In some embodiments, the one or more capping layers 114 may include one or more semiconductor materials typically used as polarization materials in III-N transistors, e.g., one or more semiconductor materials having stronger piezo-polarization behavior or properties than the III-N semiconductor material of the III-N layer 104. For example, the capping layer(s) 114 may include semiconductor materials that include aluminum, gallium, and nitrogen (e.g., $Al_xGa_{1-x}N$), or semiconductor materials that include aluminum, indium, gallium, and nitrogen (e.g., $Al_xIn_yGa_zN$). However, in general, the one or more capping layers 114 may include any semiconductor materials having a work function that is suitable to form a Schottky contact with a sufficient potential barrier difference (i.e., barrier height) between the metal material of the electrode 112 and the semiconductor material of the capping layer 114 that is in contact with the metal material of the electrode 112. In some embodiments, the barrier height may be at least about 0.2 eV, e.g., at least about 0.5 eV or at least about 1 eV. The semiconductor materials of the capping layers 114 may have a dopant concentration below that of the n-doped well 106, e.g., may be low-doped or intrinsic semiconductor materials. For example, in some embodiments, the dopant concentration of the semiconductor material(s) of the capping layer(s) 114 may be below about $10^{17}$ dopants per cubic centimeter, e.g., below about $10^{16}$ dopants per cubic centimeter or below about $10^{15}$ dopants per cubic centimeter. In some embodiments, a thickness of the capping layers 114 may be between about 2 and 50 nanometers, e.g., between about 2 and 20 nanometers, or between about 5 and 10 nanometers.

When only one capping layer 114 is implemented in the IC device 100, the capping layer 114 may be between the second portion 126-2 of the n-doped well 106 and the second electrode 112 so that one side of the capping layer 114 interfaces (e.g., is in contact with) the second portion 126-2 of the n-doped well 106 and the opposite side of the capping layer 114 interfaces (e.g., is in contact with) the second electrode 112, forming a Schottky contact of a sufficient barrier height with the second electrode 112. When two capping layers 114-1 and 114-2 are implemented in the IC device 100, the first capping layer 114-1 may be between the second capping layer 114-2 and the second electrode 112 so that one side of the first capping layer 114-1 interfaces (e.g., is in contact with) the second capping layer 114-2 and the opposite side of the first capping layer 114-1 interfaces (e.g., is in contact with) the second electrode 112, forming a Schottky contact of a sufficient barrier height with the second electrode 112. The second capping layer 114-2 may be between the first capping layer 114-1 and the second portion 126-2 of the n-doped well 106 so that one side of the second capping layer 114-2 interfaces (e.g., is in contact with) the first capping layer 114-1 and the opposite side of the second capping layer 114-2 interfaces (e.g., is in contact with) the second portion 126-2 of the n-doped well 106. In some embodiments, different ones of the capping layers 114 may have different material compositions, e.g., in order to help reduce epitaxy-induced stress. In other embodiments, different ones of the capping layers 114 may have substantially the same material composition.

Compared to the 2 DEG-based III-N diodes, the current flow in the III-N diode 101 is not restricted to a narrow potential well region (i.e., the region where the 2 DEG is formed), but is spread over the entire depth of the n-doped well 106. Moreover, in the III-N diode 101, the electrons may be injected homogeneously over the full length of the anode (the electrode 112). Consequently, the III-N diode 101 may allow achieving significantly increased on-current (e.g., greater than about 100 microampere per micrometer) compared to 2 DEG-based III-N diodes. Furthermore, the device current in the III-N diode 101 may advantageously scale with the area of the electrode 112, such that the geometrical diode parameters can be adjusted according to the needs of the application, providing a significant improvement in terms of maximum currents for the case of the bulk diode.

In some embodiments, the distance between the first portion 126-1 and the second portion 126-2 of the n-doped well 106 may be between about 2 and 50 nanometers, e.g., between about 2 and 20 nanometers, or between about 5 and 10 nanometers. In some embodiments, another cathode may be provided on the other side of the anode 112, as shown in FIG. 1 with a further electrode 110-2 (e.g., a second cathode) provided on the other side of the electrode 112. FIG. 1 further illustrates a passivation layer 120 that may be provided over portions of the n-doped well 106 in some embodiments, and the insulator 122 that may be provided over the III-N layer 104. The passivation layer 120 may include any suitable material, e.g., a material that includes silicon and nitrogen (e.g., SiN), to reduce/suppress surface currents at the surface of the n-doped well 106. The insulator 122 provided over the III-N layer 104 may serve to provide electrical isolation between various electrodes and other elements of the IC device 100.

Although not specifically shown in FIG. 1, the IC device 100 may further include additional M-N diodes similar to the III-N diode 101, described above.

Figure 2:
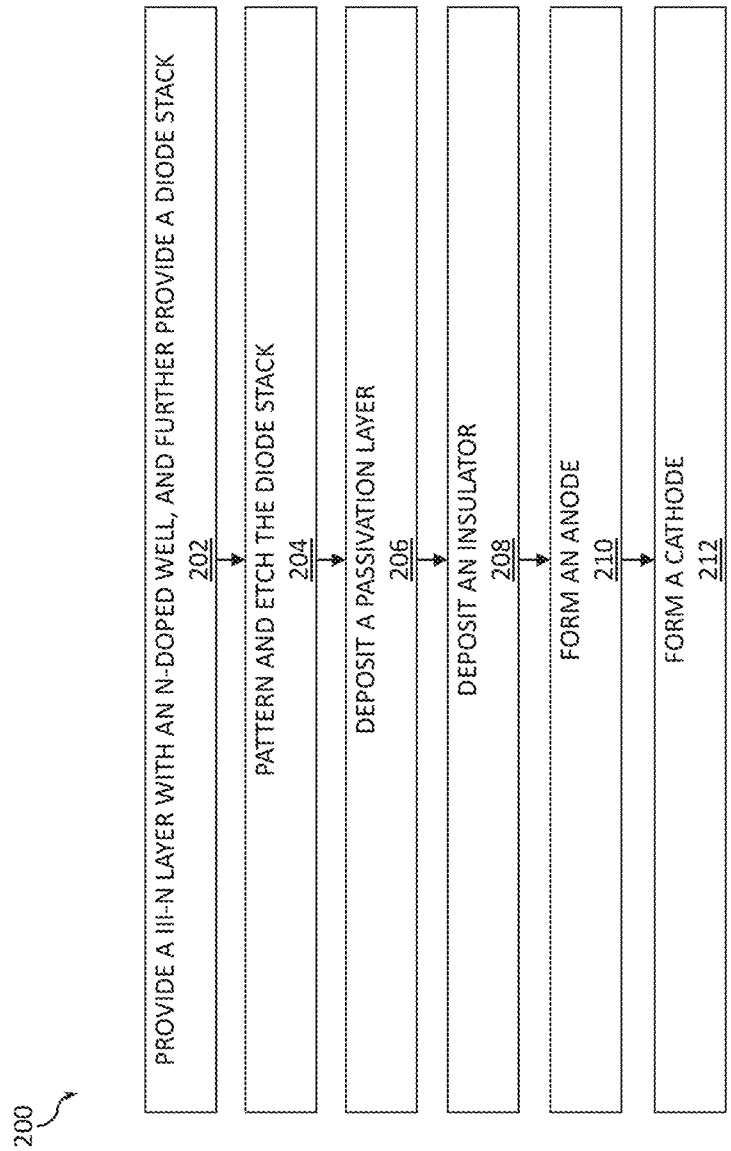
FIG. 2 is a flow diagram of an example method of manufacturing an IC device that includes a III-N diode with an n-doped well and one or more capping layers, in accordance with various embodiments of the present disclosure.
Figure 6:
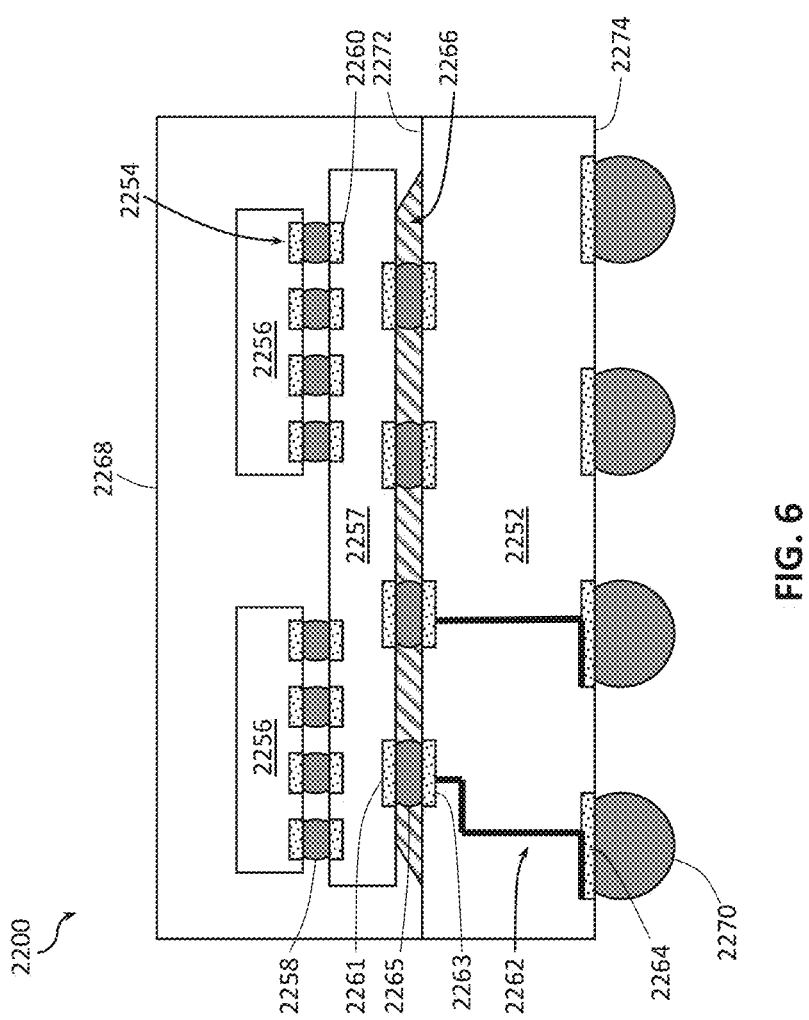
FIG. 6 is a cross-sectional side view of an IC package that may include one or more IC devices having one or more III-N diodes with n-doped wells and capping layers in accordance with any of the embodiments of the present disclosure.
Figure 7:
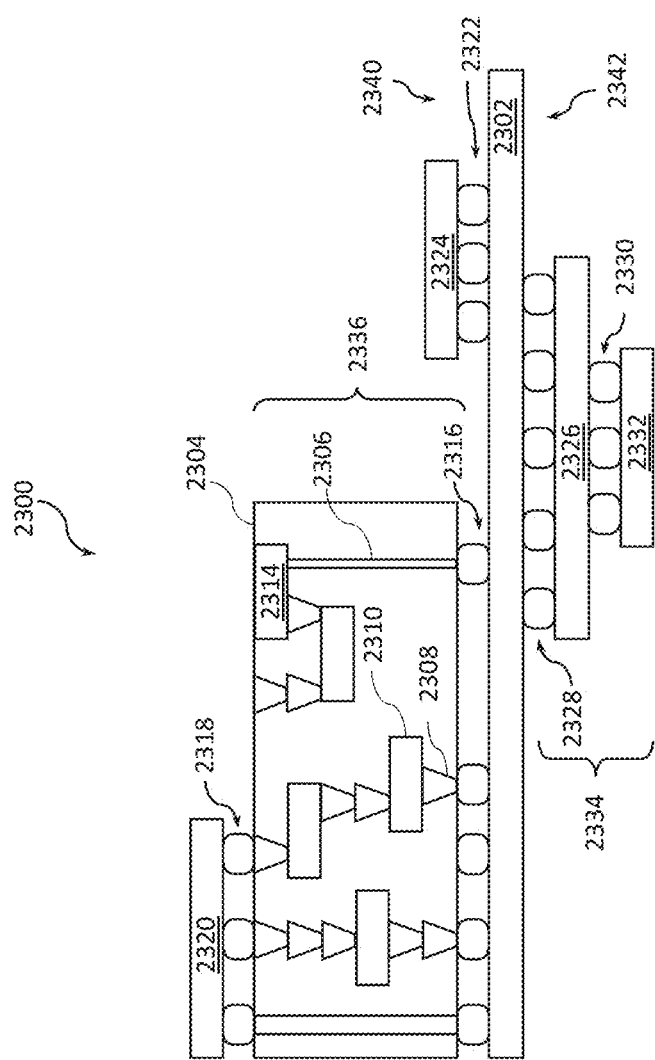
FIG. 7 is a cross-sectional side view of an IC device assembly that may include one or more IC devices having one or more III-N diodes with n-doped wells and capping layers in accordance with any of the embodiments of the present disclosure.
Figure 8:
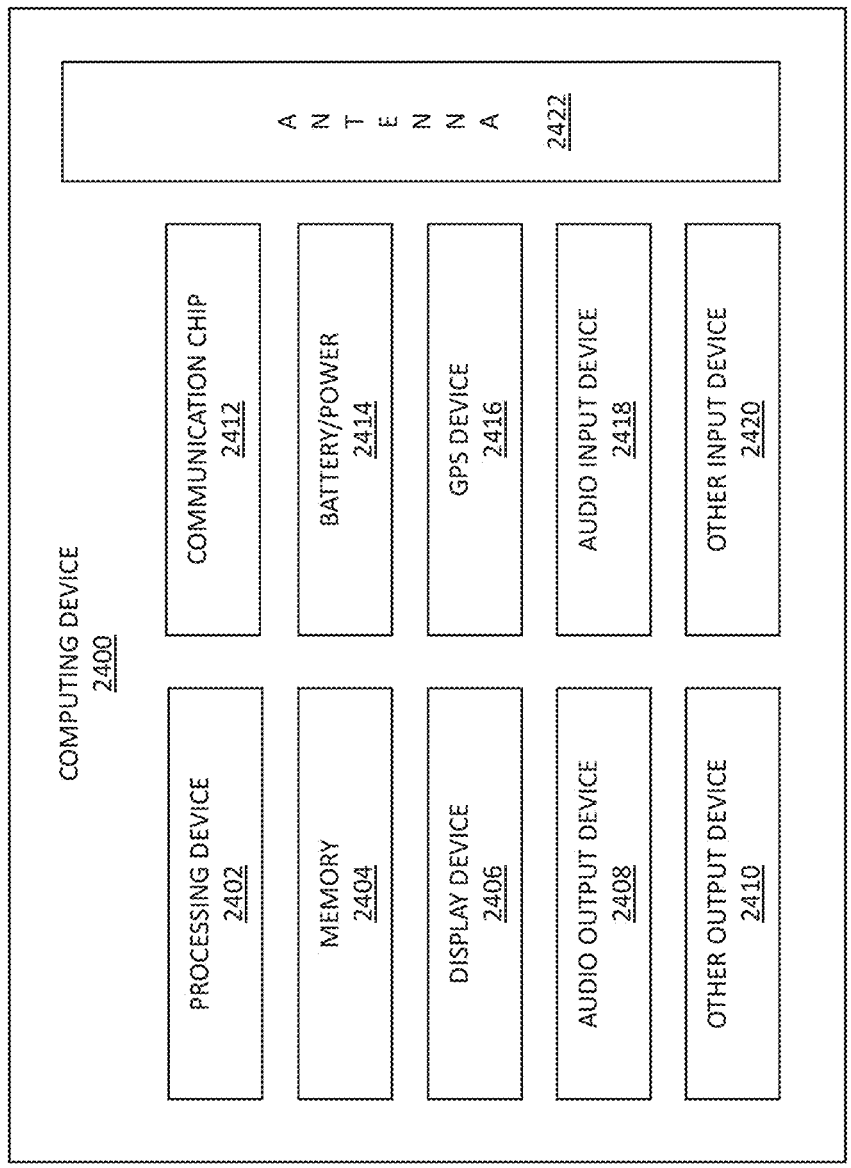
FIG. 8 is a block diagram of an example computing device that may include one or more IC devices having one or more III-N diodes with n-doped wells and capping layers in accordance with any of the embodiments of the present disclosure.

Manufacturing IC Devices with III-N Diodes with n-Doped Wells and Capping Layers The IC devices implementing one or more III-N diodes with n-doped wells and capping layers as described herein may be manufactured using any suitable techniques. FIG. 2 illustrates one example of such a method. However, other examples of manufacturing any of the IC devices described herein, as well as larger devices and assemblies that include such structures (e.g., as shown in FIGS. 6-8) are also within the scope of the present disclosure.

FIG. 2 is a flow diagram of an example method 200 of manufacturing an IC device that includes a III-N diode with an n-doped well and one or more capping layers, in accordance with various embodiments of the present disclosure. Although the operations of the method 200 are illustrated once each and in a particular order, the operations may be performed in any suitable order and repeated as desired. For example, one or more operations may be performed in parallel to manufacture, substantially simultaneously, multiple III-N diodes with n-doped wells and capping layers as described herein. In another example, the operations may be performed in a different order to reflect the structure of a particular device assembly in which one or more III-N diodes with n-doped wells and capping layers as described herein will be included. In addition, the example manufacturing method 200 may include other operations not specifically shown in FIG. 2, such as various cleaning or planarization operations as known in the art. For example, in some embodiments, the support structure 102, as well as layers of various other materials subsequently deposited thereon, may be cleaned prior to, after, or during any of the processes of the method 200 described herein, e.g., to remove oxides, surface-bound organic and metallic contaminants, as well as subsurface contamination. In some embodiments, cleaning may be carried out using e.g., a chemical solutions (such as peroxide), and/or with ultraviolet (UV) radiation combined with ozone, and/or oxidizing the surface (e.g., using thermal oxidation) then removing the oxide (e.g., using hydrofluoric acid (HF)). In another example, the IC devices/assemblies described herein may be planarized prior to, after, or during any of the processes of the method 200 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 200 may be illustrated with reference to the example embodiments shown in FIGS. 3A-3F, illustrating fabrication of an IC device as shown in FIG. 1, but the method 200 may be used to manufacture any suitable IC devices having one or more III-N diodes with n-doped wells and capping layers according to any other embodiments of the present disclosure. FIGS. 3A-3F illustrate cross-sectional side views similar to the view shown in FIG. 1, in various example stages in the manufacture of an IC device using the method of FIG. 2 in accordance with some embodiments of the present disclosure.

Figures 3A, 3B:
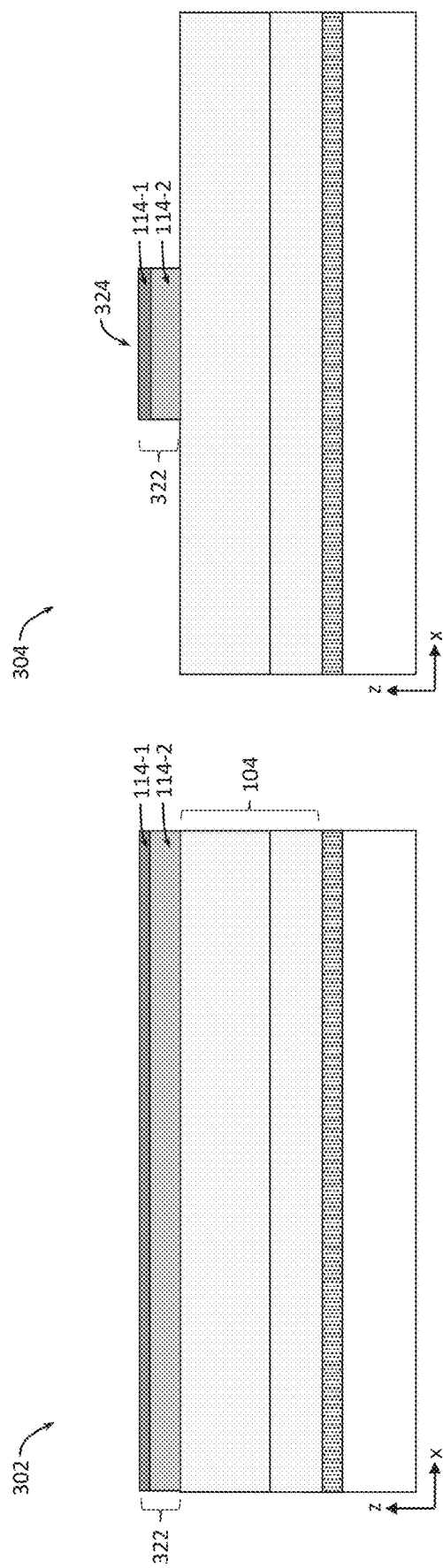

The method 200 may begin with providing a III-N layer with an n-doped well, and further providing a diode stack over a support structure (a process 202 shown in FIG. 2, a result of which is illustrated with an IC device 302 shown in FIG. 3A). The IC device 302 illustrates that the support structure provided in the process 202 may be the support structure 102 as described above and that the III-N layer with the n-doped well provided in 202 may be the III-N layer 104 with the n-doped well 106 as described above. The IC device 302 further illustrates that the diode stack provided in 202 may be a diode stack 322 that includes one or more capping layers 114 as described above. In some embodiments, the process 202 may include epitaxially growing various layers shown in FIG. 3A, e.g., for forming the buffer layer 118, the III-N material of the III-N layer 104, and the one or more capping layers 114. In this context, "epitaxial growth" refers to the deposition of crystalline overlayers in the form of the desired materials. The epitaxial growth of various layers of the process 202 may be carried out using any known gaseous or liquid precursors for forming the desired material layers.

The method 200 may then proceed with patterning the diode stack provided in the process 202 (a process 204 shown in FIG. 2, a result of which is illustrated with an IC device 304 shown in FIG. 3B). The IC device 304 illustrates that the diode stack 322 may be patterned in 204 to form a patterned diode stack 324, having a shape suitable for providing an interface between the anode and a portion of the n-doped well 106 in the final III-N diode as described above. In various embodiments, the process 204 may include any suitable patterning techniques for forming the patterned diode stack 324. Examples patterning techniques which may be used in 204 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in 204 may include an anisotropic etch, using etchants in a form of e.g., chemically active ionized gas (i.e., plasma) using e.g., bromine (Br) and chloride (Cl) based chemistries. In some embodiments, during any of the etches of the process 204, the IC device may be heated to elevated temperatures, e.g., to temperatures between about room temperature and 200 degrees Celsius, including all values and ranges therein, to promote that byproducts of the etch are made sufficiently volatile to be removed from the surface.

The method 200 may then, optionally, continue with providing a passivation layer over the IC device with a patterned diode stack that was formed in 204 (a process 206 shown in FIG. 2, a result of which is illustrated with an IC device 306 shown in FIG. 3C). The IC device 306 illustrates that the passivation layer provided in the process 206 may be the passivation layer 120 as described above. In various embodiments, process 206 may include any suitable deposition techniques for depositing the passivation layer 120, possibly in combination with any suitable patterning techniques for patterning the passivation layer 120. Example deposition techniques that may be used to deposit the passivation layer 120 in the process 206 may include, but are not limited to, spin-coating, dip-coating, atomic layer deposition (ALD), physical vapor deposition (PVD) (e.g., evaporative deposition, magnetron sputtering, or e-beam deposition), or chemical vapor deposition (CVD). Example patterning techniques that may be used to pattern the passivation layer 120 in the process 206 may include any of the patterning techniques described above with reference to the process 204.

The method 200 may then continue with providing an insulator over the IC device with a patterned diode stack that was formed in the process 204 (a process 208 shown in FIG. 2, a result of which is illustrated with an IC device 308 shown in FIG. 3D). The IC device 308 illustrates that the insulator provided in the process 208 may be the insulator 122 as described above. In various embodiments, the process 208 may include any suitable deposition techniques for depositing the insulator 122, possibly in combination with any suitable patterning techniques for patterning the insulator 122. Example deposition techniques that may be used to deposit the insulator 122 in the process 208 may include any of the deposition techniques described above with reference to the process 206. Example patterning techniques that may be used to pattern the insulator 122 in the process 208 may include any of the patterning techniques described above with reference to the process 204.

The method 200 may then continue with patterning the insulator deposited in the process 208 to provide an anode (a process 210 shown in FIG. 2, a result of which is illustrated with an IC device 310 shown in FIG. 3E) and to provide at least one cathode (a process 212 shown in FIG. 2, a result of which is illustrated with an IC device 312 shown in FIG. 3F). In some embodiments of the method 200, the order of the processes 210 and 212 may be reversed compared to what is shown in FIGS. 2 and 3, while in some other embodiments, the processes 210 and 212 may be performed simultaneously, and/or in a time-overlapping manner. In various embodiments, the processes 210 and 212 may include any suitable deposition techniques for depositing the electrically conductive materials of the electrodes 110 and 112 as described herein, possibly in combination with any suitable patterning techniques for patterning the electrodes 110 and 112. Example deposition techniques that may be used to deposit the electrically conductive materials of the electrodes 110 and 112 in the processes 210 and 212 may include any of the deposition techniques described above with reference to the process 206, as well as electroplating. Example patterning techniques that may be used to pattern the electrically conductive materials of the electrodes 110 and 112 in the processes 210 and 212 may include any of the patterning techniques described above with reference to the process 204.

Additional Devices and Assemblies

Figure 4:
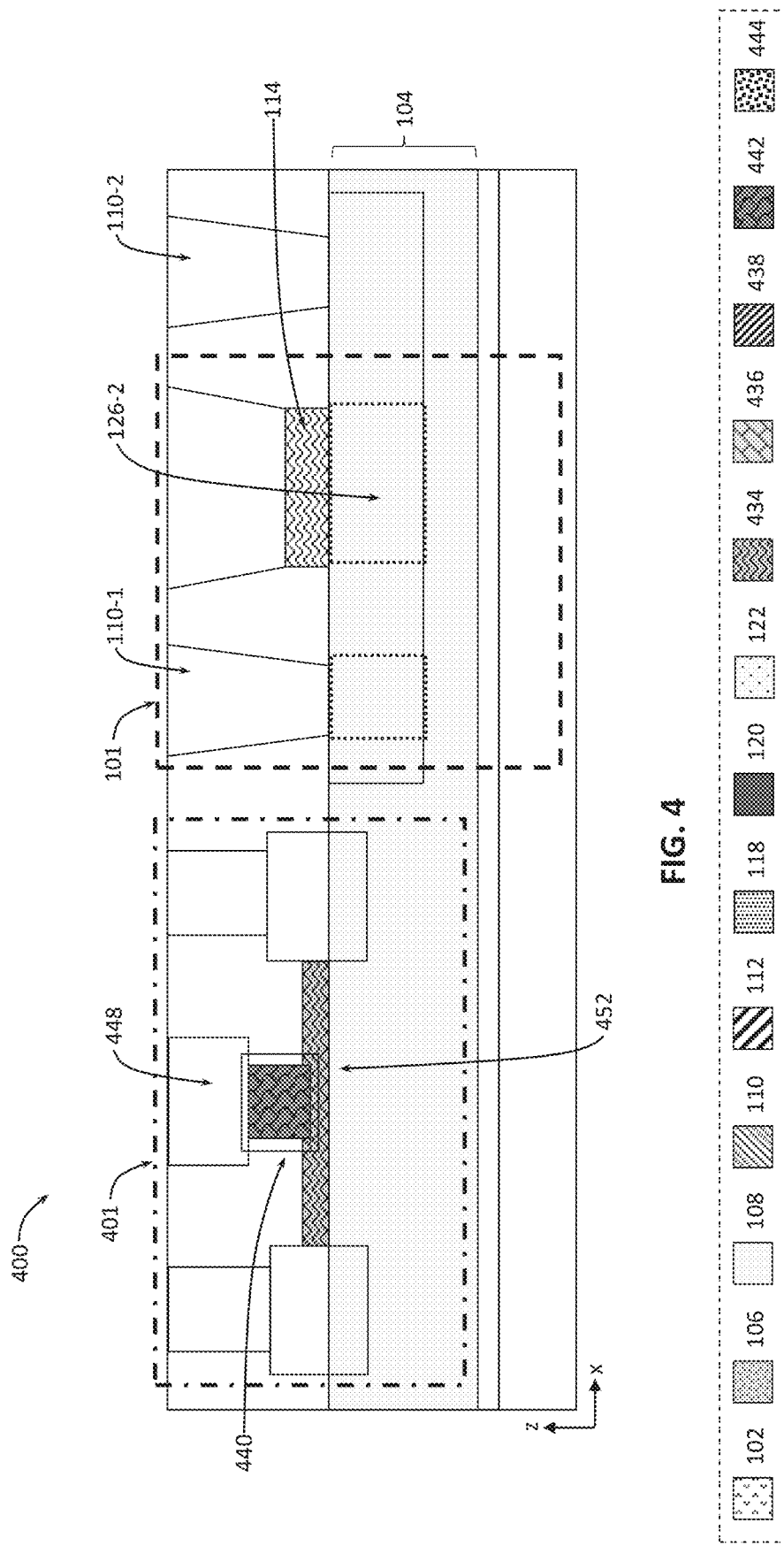
FIG. 4 provides a cross-sectional side view illustrating an IC device that includes a III-N diode with an n-doped well and one or more capping layers integrated with a III-N transistor, according to some embodiments of the present disclosure.

III-N diodes with n-doped wells and capping layers as described herein may be particularly advantageous because of ease of their integration with III-N transistors, which may be realized using conventional semiconductor processing with some additional processes to form the III-N diodes as described herein. FIG. 4 provides a cross-sectional side view illustrating an IC device 400 that includes a III-N diode with an n-doped well and one or more capping layers integrated with a III-N transistor, according to some embodiments of the present disclosure. In particular, the IC device 400 illustrates the III-diode 101 as shown in FIG. 1, and the right side of the IC device 400 is substantially the same as the IC device 100, shown in FIG. 1. Descriptions provided with reference to FIG. 1 are applicable to the IC device 400 of FIG. 4 and, in the interests of brevity, are not repeated here. Instead, only the differences are described. Similar to FIG. 1 and FIG. 3, a legend provided within a dashed box at the bottom of FIG. 4 to illustrate colors/patterns used to indicate some classes of materials of some of the elements shown in FIG. 4.

Besides having the III-N diode 101 as described above, the IC device 400 further includes a III-N transistor 401 (an approximate boundary of which is illustrated in FIG. 4 with a dash-dotted contour). As shown in FIG. 4, the III-N transistor 401 may include a polarization layer 434, source and drain (S/D) regions 436, S/D contacts 438, a gate stack 440 that includes at least a gate electrode material 442 and, optionally, also a gate dielectric material 444, and a gate contact 448.

FIG. 4 illustrates that, in some embodiments, the III-N transistor 401 and the III-N diode 101 may be implemented in substantially the same layer above the support structure 102. In particular, in some embodiments, both the III-N transistor 401 and the III-N diode 101 may be build based on the III-N layer 104 as described above. In such embodiments, a portion of the III-N layer 104 in the III-N diode 101 of the IC device 400 may be doped with n-type dopants to form the n-doped well 106 as described herein, whereas a portion of the III-N layer 104 in the III-N transistor 401 of the IC device 400 may be left undoped or low-doped, i.e., the III-N layer 104 in the III-N transistor 401 may be formed of the further III-N material 108 as described above. Furthermore, the polarization layer 434 of the III-N transistor 401 may be substantially aligned with the one or more capping layers 114 of the III-N diode 101 of the IC device 400, which may be advantageous if the polarization layer 434 and the one or more capping layers 114 are deposited in a single process so that the material of the polarization layer 434 may be substantially the same as the material of any of the one or more capping layers 114. Thicknesses of the polarization layer 434 and the one or more capping layers 114 in the IC device 400 may be different. For example, in some embodiments, the total thickness of the one or more capping layers 114 may be greater than that of the polarization layer 434, e.g., at least about 5 nanometers greater, including all values and ranges therein, e.g., at least about 10 nanometers greater, or at least about 15 nanometers greater.

In general, the polarization material 434 may be a layer of a charge-inducing film of a material having larger spontaneous and/or piezoelectric polarization than that of the bulk of the III-N layer material immediately below it (e.g., the further III-N material 108), creating a heterojunction (i.e., an interface that occurs between two layers or regions of semiconductors having unequal band gaps) with the further III-N material 108, and leading to formation of 2 DEG at or near (e.g., immediately below) that interface during operation of the III-N transistor 401. In various embodiments, the polarization material 434 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers.

As also shown in FIG. 1, the III-N transistor 401 may include two S/D regions 436, where one of the S/D regions 436 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., for a transistor channel 452) of the transistor (e.g., the III-N transistor 401). In some embodiments, the S/D regions 436 may include highly doped semiconductor materials, such as highly doped InGaN. Often, the S/D regions may be highly doped, e.g., with dopant concentrations of at least above $1 \cdot 10^{21}$ dopants per cubic centimeter, in order to advantageously form ohmic contacts with the respective S/D contacts/electrodes of the III-N transistor 401 (e.g., the S/D contacts/electrodes 438 shown in FIG. 4), although these regions may also have lower dopant concentrations in some implementations. Regardless of the exact doping levels, the S/D regions 436 are the regions having dopant concentration higher than in other regions between the source region (e.g., the S/D region 436 shown on the left side in FIG. 4) and the drain region (e.g., the S/D region 436 shown on the right side in FIG. 4), i.e., higher than in the further III-N material 108. For that reason, sometimes the S/D regions are referred to as highly doped (HD) S/D regions. In further embodiments, one or more layers of metal and/or metal alloys may be used to form the S/D regions 436.

The electrically conductive material of the S/D contacts/ electrodes 438 may include any suitable electrically conductive material, alloy, or a stack of multiple electrically conductive materials, such as any materials described with reference to the electrodes 110, 112. Furthermore, in some embodiments, the electrically conductive material of the S/D contacts/electrodes 438 may include a doped semiconductor, such as silicon or another semiconductor doped with an n-type dopant or a p-type dopant. Metals may provide higher conductivity, while doped semiconductors may be easier to pattern during fabrication. In some embodiments, the S/D contacts/electrodes 438 may have a thickness between about 2 nanometers and 1000 nanometers, preferably between about 2 nanometers and 100 nanometers. An electrically conductive material similar to that of the S/D contacts/ electrodes 438 may also be used to form a gate contact/ electrode 448, i.e., to form electrical contact to the gate electrode material 442 of the III-N transistor 401. In various embodiments, the exact material compositions of the electrically conductive materials may be the same or different when used to implement different contacts/electrodes of different devices within the IC device 400.

Turning to the gate stack 440 provided over the channel portion of the III-N transistor 401, the gate stack 404 may include a layer of a gate dielectric material 444, and a gate electrode material 442.

The gate dielectric material 444 is typically a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 444 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 444 during manufacture of the III-N transistor 401 to improve the quality of the gate dielectric material 444. A thickness of the gate dielectric material 444 may be between 0.5 nanometers and 3 nanometers, including all values and ranges therein, e.g., between 1 and 3 nanometers, or between 1 and 2 nanometers.

The gate electrode material 442 may include at least one p-type work function metal or n-type work function metal, depending on whether the III-N transistor 401 is a p-type MOS (PMOS) transistor or an n-type MOS (NMOS) transistor (e.g., p-type work function metal may be used as the gate electrode material 442 when the III-N transistor 401 is a PMOS transistor and n-type work function metal may be used as the gate electrode material 442 when the III-N transistor 401 is an NMOS transistor, depending on the desired threshold voltage). For a PMOS transistor, metals that may be used for the gate electrode material 442 may include, but are not limited to, ruthenium, palladium, platinum, cobalt, nickel, titanium nitride, and conductive metal oxides (e.g., ruthenium oxide). For an NMOS transistor, metals that may be used for the gate electrode material 442 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 442 may include a stack of two or more metal layers, where one or more metal layers are work function metal layers and at least one metal layer is a fill metal layer.

Further layers may be included next to the gate electrode material 442 for other purposes, such as to act as a diffusion barrier layer or/and an adhesion layer, not specifically shown in FIG. 4. Furthermore, in some embodiments, the gate dielectric material 444 and the gate electrode material 442 may be surrounded by a gate spacer, not shown in FIG. 4, configured to provide separation between the gates of different transistors. Such a gate spacer may be made of a low-k dielectric material (i.e., a dielectric material that has a lower dielectric constant (k) than silicon dioxide which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

The IC devices 100, 400 illustrated in FIGS. 1 and 4 do not represent an exhaustive set of IC devices and assemblies in which one or more III-N diodes with n-doped wells and capping layers as described herein may be provided, but merely provide examples of such structures/assemblies. Although particular arrangements of materials are discussed with reference to FIGS. 1, 3, and 4, intermediate materials may be included in various portions of these figures. Note that FIGS. 1, 3, and 4 are intended to show relative arrangements of some of the components therein, and that various device components of these figures may include other components that are not specifically illustrated, e.g., various interfacial layers or various additional layers or elements. For example, although not specifically shown, the IC devices 100 and/or 400 may include a solder resist material (e.g., polyimide or similar material) and one or more bond pads formed on upper-most interconnect layers of these IC devices. The bond pads may be electrically coupled with further interconnect structure(s) and configured to route the electrical signals between the III-N diode 101, the III-N transistor 401, and other external devices. For example, solder bonds may be formed on the one or more bond pads to mechanically and/or electrically couple a chip including the IC devices 100 and/or 400 with another component (e.g., a circuit board). The IC devices 100 and/or 400 may have other alternative configurations to route the electrical signals from the interconnect layers, e.g., the bond pads described above may be replaced by or may further include other analogous features (e.g., posts) that route the electrical signals to external components.

Additionally, although some elements of the IC devices are illustrated in FIGS. 1, 3, and 4 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIG. 4 may illustrate some elements, e.g., the S/D regions 436, the S/D electrodes 438, etc., as having perfectly straight sidewall profiles, i.e., profiles where the sidewalls extend perpendicularly to the support structure 102, these idealistic profiles may not always be achievable in real-world manufacturing processes. Therefore, descriptions of various embodiments of III-N diodes with n-doped wells and capping layers, provided herein, are equally applicable to embodiments where various elements of the resulting IC devices look different from those shown in the figures due to manufacturing processes used to form them.

IC devices that include one or more III-N diodes with n-doped wells and capping layers as disclosed herein may be included in any suitable electronic device or component. FIGS. 5-8 illustrate various examples of devices and components that may include one or more III-N diodes with n-doped wells and capping layers as disclosed herein.

Figure 5B:
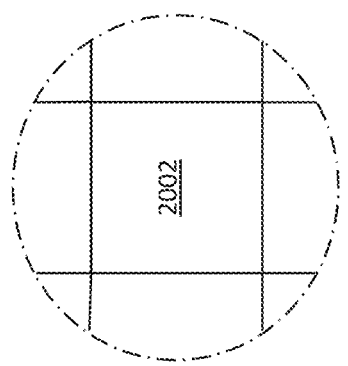
FIGS. 5A-5B are top views of a wafer and dies that may include one or more IC devices having one or more III-N diodes with n-doped wells and capping layers in accordance with any of the embodiments of the present disclosure.
Figure 5A:
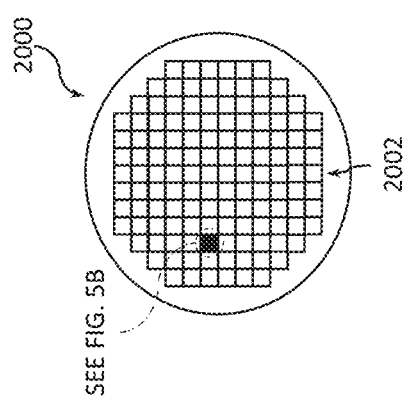

FIGS. 5A-5B are top views of a wafer 2000 and dies 2002 that may include one or more III-N diodes with n-doped wells and capping layers in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more III-N diodes with n-doped wells and capping layers as described herein). After the fabrication of the semiconductor product is complete (e.g., after manufacture of one or more III-N diodes with n-doped wells and capping layers as described herein, e.g., after manufacture of any embodiment of the IC device 100 described herein), the wafer 2000 may undergo a singulation process in which each of the dies 2002 is separated from one another to provide discrete "chips" of the semiconductor product. In particular, devices that include one or more III-N diodes with n-doped wells and capping layers as disclosed herein may take the form of the wafer 2000 (e.g., not singulated) or the form of the die 2002 (e.g., singulated). The die 2002 may include one or more diodes (e.g., one or more III-N diodes with n-doped wells and capping layers as described herein), one or more transistors (e.g., one or more III-N transistors as described herein) as well as, optionally, supporting circuitry to route electrical signals to the III-N diodes with n-doped wells and capping layers and III-N transistors, as well as any other IC components. In some embodiments, the wafer 2000 or the die 2002 may implement an ESD protection device, an RF FE device, a memory device (e.g., a static random-access memory (SRAM) device), a logic device (e.g., an AND, OR, NAND, or NOR gate), or any other suitable circuit element. Multiple ones of these devices may be combined on a single die 2002.

FIG. 6 is a side, cross-sectional view of an example IC package 2200 that may include one or more IC devices having one or more III-N diodes with n-doped wells and capping layers in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC device having one or more III-N diodes with n-doped wells and capping layers, e.g., any of the IC devices 100, described herein. In embodiments in which the IC package 2200 includes multiple dies 2256, the IC package 2200 may be referred to as a multi-chip package. Importantly, even in such embodiments of an MCP implementation of the IC package 2200, one or more III-N diodes with n-doped wells and capping layers may be provided in a single chip, in accordance with any of the embodiments described herein. The dies 2256 may include circuitry to perform any desired functionality. For example, one or more of the dies 2256 may be ESD protection dies, including one or more III-N diodes with n-doped wells and capping layers as described herein, one or more of the dies 2256 may be logic dies (e.g., silicon-based dies), one or more of the dies 2256 may be memory dies (e.g., high bandwidth memory), etc. In some embodiments, any of the dies 2256 may include one or more III-N diodes with n-doped wells and capping layers, e.g., as discussed above; in some embodiments, at least some of the dies 2256 may not include any III-N diodes with n-doped wells and capping layers.

The IC package 2200 illustrated in FIG. 6 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

FIG. 7 is a cross-sectional side view of an IC device assembly 2300 that may include components having one or more IC devices implementing one or more III-N diodes with n-doped wells and capping layers in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC devices implementing one or more III-N diodes with n-doped wells and capping layers in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more III-N diodes with n-doped wells and capping layers in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include one or more III-N diodes with n-doped wells and capping layers as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC devices implementing one or more III-N diodes with n-doped wells and capping layers as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 8 is a block diagram of an example computing device 2400 that may include one or more components with one or more IC devices having one or more III-N diodes with n-doped wells and capping layers in accordance with any of the embodiments disclosed herein. For example, any suitable ones of the components of the computing device 2400 may include a die (e.g., the die 2002 of FIG. 5B) including one or more III-N diodes with n-doped wells and capping layers in accordance with any of the embodiments disclosed herein. Any of the components of the computing device 2400 may include an IC device (e.g., any embodiment of the IC devices of FIGS. 1-4) and/or an IC package (e.g., the IC package 2200 of FIG. 6). Any of the components of the computing device 2400 may include an IC device assembly (e.g., the IC device assembly 2300 of FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC devices having one or more III-N diodes with n-doped wells and capping layers as described herein may be particularly advantageous for use as part of ESD circuits protecting power amplifiers, low-noise amplifiers, filters (including arrays of filters and filter banks), switches, or other active components. In some embodiments, IC devices having one or more III-N diodes with n-doped wells and capping layers as described herein may be used in PMICs, e.g., as a rectifying diode for large currents. In some embodiments, IC devices having one or more III-N diodes with n-doped wells and capping layers as described herein may be used in audio devices and/or in various input/output devices.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC device that includes a support structure (e.g., a substrate, a wafer, a die, or a chip); a III-N layer, provided over a portion of the support structure, the III-N layer including an n-doped well of a III-N semiconductor material with n-type dopants at a dopant concentration of at least $5 \times 10^{17}$ dopants per cubic centimeter; a first electrode, interfacing (e.g., in contact with) a first portion of the n-doped well; a capping layer, interfacing (e.g., in contact with) a second portion of the n-doped well, the capping layer including a semiconductor material with a dopant concentration below $10^{17}$ dopants per cubic centimeter; and a second electrode, where the capping layer is between the second portion of the n-doped well and the second electrode.

Example 2 provides the IC device according to example 1, where the semiconductor material of the capping layer is a polarization material (e.g., a semiconductor material having stronger piezo-polarization behavior/properties than the III-N semiconductor material).

Example 3 provides the IC device according to examples 1 or 2, where the semiconductor material of the capping layer includes aluminum, gallium, and nitrogen (e.g., $Al_xGa_{1-x}N$).

Example 4 provides the IC device according to example 3, where the semiconductor material of the capping layer further includes indium (e.g., $Al_xIn_xGa_zN$).

Example 5 provides the IC device according to any one of the preceding examples, where a thickness of the capping layer is between about 2 and 50 nanometers, e.g., between about 2 and 20 nanometers, or between about 5 and 10 nanometers.

Example 6 provides the IC device according to any one of the preceding examples, where the dopant concentration of the semiconductor material of the capping layer is below $10^{16}$ dopants per cubic centimeter.

Example 7 provides the IC device according to any one of the preceding examples, where the capping layer is a first capping layer, the IC device further includes a second capping layer, the second capping layer includes a semiconductor material with a dopant concentration below $10^{17}$ dopants per cubic centimeter, the first capping layer is between the second capping layer and the second electrode, and the second capping layer is between the first capping layer and the second portion of the n-doped well.

Example 8 provides the IC device according to example 7, where a material composition of the semiconductor material of the second capping layer is different from a material composition of the semiconductor material of the first capping layer.

Example 9 provides the IC device according to examples 7 or 8, where the semiconductor material of the second capping layer includes aluminum, gallium, and nitrogen (e.g., $Al_xGa_{1-x}N$).

Example 10 provides the IC device according to example 9, where the semiconductor material of the second capping layer further includes indium (e.g., $Al_xIn_yGa_zN$).

Example 11 provides the IC device according to any one of examples 7-10, where a thickness of the second capping layer is between about 2 and 50 nanometers, e.g., between about 2 and 20 nanometers, or between about 5 and 10 nanometers.

Example 12 provides the IC device according to any one of the preceding examples, where the dopant concentration of the semiconductor material of the second capping layer is below $10^{16}$ dopants per cubic centimeter.

Example 13 provides the IC device according to any one of the preceding examples, where a thickness of the n-doped well is between about 50 and 5000 nanometers, e.g., between about 50 and 2000 nanometers, or between about 100 and 1000 nanometers.

Example 14 provides the IC device according to any one of the preceding examples, where the III-N semiconductor material includes nitrogen and gallium, and optionally, one or more of indium or aluminum (e.g., GaN, InGaN, or AlGaN).

Example 15 provides the IC device according to any one of the preceding examples, where the dopant concentration of the n-type dopants of the n-doped well is at least $10^{18}$ dopants per cubic centimeter.

Example 16 provides the IC device according to any one of the preceding examples, further including a further III-N semiconductor material between the III-N semiconductor material of the n-doped well and the support structure, where the dopant concentration of the further III-N semiconductor material is below $10^{17}$ dopants per cubic centimeter.

Example 17 provides the IC device according to example 16, where a thickness of the further III-N semiconductor material is between about 50 and 5000 nanometers, e.g., between about 50 and 2000 nanometers, or between about 100 and 1000 nanometers.

Example 18 provides the IC device according to any one of the preceding examples, further including a buffer material between the III-N layer and the support structure, where a band gap of the buffer material is greater than a band gap of the III-N semiconductor material.

Example 19 provides the IC device according to example 18, where the buffer material includes a material including aluminum, gallium, and nitrogen (e.g., AlGaN), and/or a material including aluminum and nitrogen (e.g., AlN).

Example 20 provides the IC device according to examples 18 or 19, where a thickness of the buffer material is between about 100 and 5000 nanometers, e.g., between about 250 and 500 nanometers.

Example 21 provides the IC device according to any one of the preceding examples, where the support structure is a substrate, a die, a wafer, or a chip.

Example 22 provides the IC device according to any one of the preceding examples, where a distance between the first portion of the n-doped well and the second portion of the n-doped well is between about 2 and 500 nanometers, e.g., between about 50 and 300 nanometers, or between about 80 and 200 nanometers.

Example 23 provides an IC package that includes an IC die, the IC die including an IC device according to any one of the preceding examples, e.g., an IC device any one of examples 1-22, and a further IC component, coupled to the IC die. For example, the IC package may include an IC device that includes a III-N layer, the III-N layer including an n-doped well of a III-N semiconductor material with n-type dopants at a dopant concentration of at least $5 \times 10^{17}$ dopants per cubic centimeter; a cathode, over (e.g., in contact with) a first portion of the n-doped well; a capping layer, over (e.g., in contact with) a second portion of the n-doped well, the capping layer including a semiconductor material with a dopant concentration below $10^{17}$ dopants per cubic centimeter; and an anode, where the capping layer is between the second portion of the n-doped well and the anode.

Example 24 provides the IC package according to example 23, where the IC device further includes a III-N transistor provided over a portion of the III-N layer that includes a III-N semiconductor material with dopants at a dopant concentration below $10^{16}$ dopants per cubic centimeter.

Example 25 provides the IC package according to example 24, where the n-doped well, the cathode, the anode, and the capping layer form a III-N diode, and the III-N diode is coupled to the M-N transistor.

Example 26 provides the IC package according to example 25, where the III-N diode is to provide ESD protection for the III-N transistor.

Example 27 provides the IC package according to any one of examples 23-26, where the further IC component includes one of a package substrate, an interposer, or a further IC die.

Example 28 provides a method for fabricating an IC device, the method including providing a III-N layer over a support structure, the III-N layer including an n-doped well of a III-N semiconductor material with n-type dopants at a dopant concentration of at least $5 \times 10^{17}$ dopants per cubic centimeter; providing a diode stack structure over a first portion of the n-doped well, the diode stack structure including one or more capping layers that include one or more semiconductor materials with a dopant concentration below $10^{17}$ dopants per cubic centimeter; providing a first electrode, interfacing (e.g., in contact with) the diode stack structure so that the one or more capping layers are between the first portion of the n-doped well and the first electrode; and providing a second electrode, interfacing (e.g., in contact with) a second portion of the n-doped well.

Example 29 provides the method according to example 28, where providing the III-N layer includes depositing the III-N semiconductor material over the support structure, and providing the n-doped well in a portion of the III-N semiconductor material.

Example 30 provides the method according to example 29, where providing the n-doped well in the portion of the III-N semiconductor material includes performing ion implantation of the n-type dopants in the portion of the III-N semiconductor material.

Example 31 provides the method according to any one of examples 28-30, further including providing a III-N transistor over a portion of the III-N layer that includes the III-N semiconductor material with dopants at a dopant concentration below about $10^{16}$ dopants per cubic centimeter.

Example 32 provides the method according to any one of examples 28-31, further including processes for forming the IC device according to any one of the preceding examples.

Example 33 provides the method according to any one of examples 28-32, further including processes for forming the IC package according to any one of the preceding examples.

Example 34 provides an electronic device (e.g., a computing device) that includes a carrier substrate; and an IC die coupled to the carrier substrate, where the IC die includes the IC device according to any one of examples 1-22, and/or is included in the IC package according to any one of examples 23-27.

Example 35 provides the electronic device according to example 34, where the electronic device is a wearable or handheld electronic device.

Example 36 provides the electronic device according to examples 34 or 35, where the electronic device further includes one or more communication chips and an antenna.

Example 37 provides the electronic device according to any one of examples 34-36, where the carrier substrate is a motherboard.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:
a base;
a semiconductor layer over a portion of the base, wherein the semiconductor layer includes a region of a III-N semiconductor material with n-type dopants at a dopant concentration of at least $5 \times 10^{17}$ dopants per cubic centimeter;
a first electrode interfacing a first portion of the region;
a first capping layer interfacing a second portion of the region, wherein the first capping layer includes a semiconductor material with a dopant concentration below $10^{17}$ dopants per cubic centimeter;
a second capping layer between the first capping layer and the second portion of the region, wherein the second capping layer includes a semiconductor material with a dopant concentration below $10^{17}$ dopants per cubic centimeter, and a thickness of the second capping layer is between about 2 and 50 nanometers; and
a second electrode, wherein the first capping layer is between the second capping layer and the second electrode.

2. The IC device according to claim 1, wherein the semiconductor material of the first capping layer is a polarization material.

3. The IC device according to claim 1, wherein a thickness of the first capping layer is between about 2 and 50 nanometers.

4. The IC device according to claim 1, wherein the dopant concentration of the semiconductor material of the first capping layer is below $10^{16}$ dopants per cubic centimeter.

5. The IC device according to claim 1, wherein the dopant concentration of the semiconductor material of the second capping layer is below $10^{16}$ dopants per cubic centimeter.

6. The IC device according to claim 1, wherein a thickness of the region is between about 50 and 5000 nanometers.

7. The IC device according to claim 1, wherein the dopant concentration of the n-type dopants of the region is at least $10^{18}$ dopants per cubic centimeter.

8. The IC device according to claim 1, further including a further III-N semiconductor material between the III-N semiconductor material of the region and the base, wherein the dopant concentration of the further III-N semiconductor material is below $10^{17}$ dopants per cubic centimeter.

9. The IC device according to claim 8, wherein a thickness of the further III-N semiconductor material is between about 50 and 5000 nanometers.

10. The IC device according to claim 8, further including a transistor, wherein the transistor includes the further III-N semiconductor material.

11. The IC device according to claim 1, further including a further material between the semiconductor layer and the base, wherein a band gap of the further material is greater than a band gap of the III-N semiconductor material.

12. The IC device according to claim 1, wherein a distance between the first portion of the region and the second portion of the region is between about 2 and 500 nanometers.

13. The IC device according to claim 1, wherein the first capping layer is between the second portion of the region and the second electrode.

14. An integrated circuit (IC) package, comprising:
an IC die comprising an IC device, wherein the IC device includes:
a III-N layer comprising an n-doped well of a III-N semiconductor material with n-type dopants at a dopant concentration of at least $5 \times 10^{17}$ dopants per cubic centimeter,
a cathode over a first portion of the n-doped well,
a capping layer over a second portion of the n-doped well, wherein the capping layer includes a semiconductor material with a dopant concentration below $10^{17}$ dopants per cubic centimeter,
an anode, wherein the capping layer is between the second portion of the n-doped well and the anode, and
a III-N transistor over a portion of the III-N layer that includes a III-N semiconductor material with dopants at a dopant concentration below $10^{16}$ dopants per cubic centimeter; and
a further IC component, coupled to the IC die.

15. The IC package according to claim 14, wherein:
the IC device includes a diode,
the diode includes the n-doped well, the cathode, the anode, and the capping layer, and
the diode is coupled to the III-N transistor.

16. The IC package according to claim 15, wherein the diode an electrostatic discharge protection diode.

17. A process of making an integrated circuit (IC) device, the process comprising:
providing a semiconductor layer over a base, the semiconductor layer including a region of a III-N semiconductor material with n-type dopants at a dopant concentration of at least $5 \times 10^{17}$ dopants per cubic centimeter;
providing a diode stack structure over a first portion of the region, the diode stack structure including one or more capping layers that include one or more semiconductor materials with a dopant concentration below $10^{17}$ dopants per cubic centimeter;
providing a first electrode, interfacing the diode stack structure so that the one or more capping layers are between the first portion of the region and the first electrode;
providing a second electrode, interfacing a second portion of the region; and
providing a transistor over a portion of the III-N layer that includes the III-N semiconductor material with dopants at a dopant concentration below about $10^{16}$ dopants per cubic centimeter.

18. The process according to claim 17, wherein providing the semiconductor layer includes:
depositing the III-N semiconductor material over the base, and providing the region in a portion of the III-N semiconductor material.

19. The process according to claim 17, wherein the transistor is a III-N transistor.

20. An integrated circuit (IC) device, comprising:
a support structure;
a III-N layer over a portion of the support structure, the III-N layer including an n-doped well of a III-N semiconductor material with n-type dopants at a dopant concentration of at least $5\times10^{17}$ dopants per cubic centimeter;
a first electrode interfacing a first portion of the n-doped well;
a capping layer interfacing a second portion of the n-doped well, wherein the capping layer includes a semiconductor material with a dopant concentration below $10^{17}$ dopants per cubic centimeter, and wherein a distance between the first portion of the n-doped well and the second portion of the n-doped well is between about 2 and 500 nanometers; and
a second electrode, where the capping layer is between the second portion of the n-doped well and the second electrode.

21. The IC device according to claim 20, wherein:
the capping layer is a first capping layer,
the IC device further includes a second capping layer,
the second capping layer includes a semiconductor material with a dopant concentration below $10^{17}$ dopants per cubic centimeter,
the first capping layer is between the second capping layer and the second electrode, and
the second capping layer is between the first capping layer and the second portion of the n-doped well.

22. The IC device according to claim 21, wherein a thickness of the second capping layer is between about 2 and 50 nanometers.

23. The IC device according to claim 20, wherein a thickness of the n-doped well is between about 50 and 5000 nanometers.

* * * * *

UNITED STATES PATENT AND TRADEMARK OFFICE
CERTIFICATE OF CORRECTION

| | |
|---|---|
| PATENT NO. | : 12,396,232 B2 |
| APPLICATION NO. | : 17/459986 |
| DATED | : August 19, 2025 |
| INVENTOR(S) | : Richard Geiger et al. |

Page 1 of 1

It is certified that error appears in the above-identified patent and that said Letters Patent is hereby corrected as shown below:

In the Claims

In Column 28, Claim 16, Line 41, delete "an" and insert -- is an --, therefor.

Signed and Sealed this
Seventh Day of October, 2025

John A. Squires
*Director of the United States Patent and Trademark Office*